(12) United States Patent
Koch et al.

(10) Patent No.: US 7,535,227 B1
(45) Date of Patent: May 19, 2009

(54) METHOD AND APPARATUS FOR CORRECTING DISTORTION IN MR IMAGES CAUSED BY METALLIC IMPLANTS

(75) Inventors: Kevin M. Koch, Waukesha, WI (US); Richard Scott Hinks, Waukesha, WI (US); David Thomas Gering, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/925,141

(22) Filed: Oct. 26, 2007

(51) Int. Cl.
*G01V 3/00* (2006.01)
(52) U.S. Cl. ....................... 324/309; 324/307
(58) Field of Classification Search ............. 324/309, 324/307
See application file for complete search history.

(56) References Cited

U.S. PATENT DOCUMENTS

| | | | | |
|---|---|---|---|---|
| 4,982,159 | A * | 1/1991 | Hoshino | 324/312 |
| 5,005,578 | A * | 4/1991 | Greer et al. | 600/414 |
| 5,617,028 | A * | 4/1997 | Meyer et al. | 324/320 |
| 6,150,815 | A * | 11/2000 | Janzen et al. | 324/309 |
| 6,806,707 | B2 * | 10/2004 | Schreck | 324/307 |

OTHER PUBLICATIONS

Koch et al., "Rapid calculations of susceptibiity-induced magnetostatic field perturbations for in vivo magnetic resonance," Institute of Physics Publishing, Physics In Medicine and Biology, vol. 51, pp. 6381-6402, 2006.
Jezzard et al., "Correction for Geometric Distortion in Echo Planar Images from B0 Field Variations," MRM, vol. 34, pp. 65-73, 1995, Laboratory of Cardiac Energetics, NHLBI, National Institutes of Health, Bethesda, Maryland.
Morgan et al., "Correction of Spatial Distortion in EPI Due to Inhomogeneous Static Magnetic Fields Using the Reversed Gradient Method," Journal of Magnetic Resonance Imaging, vol. 19, pp. 499-507, 2004, Wiley-Liss, Inc.
Voss et al., "Fiber tracking in the cervical spine and inferior brain regions with reversed gradient diffusion tensor imaging," Magnetic Resonance Imaging, vol. 24, pp. 231-239, 2006, Elsevier Inc.
Chang et al., "A Technique for Accurate Magnetic Resonance Imaging in the Presence of Field Inhomogeneities,", IEEE Transactions On Medical Imaging, vol. 11, No. 3, Sep. 1992, pp. 319-329.

* cited by examiner

*Primary Examiner*—Louis M Arana
(74) *Attorney, Agent, or Firm*—Ziolkowski Patent Solutions Group, SC (57) ABSTRACT

A technique for reconstructing a corrected MR image from MR images distorted by foreign object induced magnetic fields includes locating a foreign object in a subject and defining a localized area of a field of view about the foreign object where a magnetic field distortion adversely affects a first magnetic distortion correction technique. The first magnetic distortion correction technique is applied to the field of view other than in the localized area. A second magnetic distortion correction technique is applied to the localized area and the results of the application of the first and second magnetic distortion correction techniques are combined. An image is reconstructed based on the results of the application of the first and second magnetic distortion correction techniques.

24 Claims, 7 Drawing Sheets

METHOD AND APPARATUS FOR CORRECTING DISTORTION IN MR IMAGES CAUSED BY METALLIC IMPLANTS

BACKGROUND OF THE INVENTION

The present invention relates generally to magnetic resonance—(MR) imaging and, more particularly, to a method and apparatus of correcting distortion in an MR image caused by an implant.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment Mt. A signal is emitted by the excited spins after the excitation signal $B_1$ is terminated and this signal may be received and processed to fill a data acquisition or k-space matrix. The data stored in the k-space matrix may then be processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

It is well known that, in the presence of a foreign object, the magnetic fields used in MR imaging often induce magnetic fields about the foreign object that can cause noticeable distortion in the resulting MR image. All materials have some form of magnetism, which is measured by its respective magnetic susceptibility, $\chi$. Magnetic susceptibility is a measure on how a material reacts to external magnetic fields. This "reaction" of materials to magnetic fields is fundamentally manifested in the magnetic field they induce in response to the external field. Higher magnitudes of magnetic susceptibility induce more severe magnetic fields. In magnetic resonance, a very large magnetic field of relative spatial homogeneity is used to polarize nuclear (or electronic) spins. When a material is placed in this magnetic field, its magnetic susceptibility distribution causes an induced magnetic field. It is this induced magnetic field that can cause distortion in MR images. On its own, the human body induces such fields. However, the magnetic susceptibilities of organic tissue and air have magnitudes roughly 10-100 times less than the relative magnetic susceptibilities of metallic implant components and their surrounding tissue, depending on the type and shape of the metal used in the implant. Therefore, the magnetic fields induced by metallic implants are far more severe and troublesome than the induced fields typically dealt with in biological magnetic resonance applications.

Techniques have been developed to correct distortion caused by a substance's induced magnetic field. One such technique is the "line-integral" technique. The basic principle of this technique is described hereinafter and assumes distortion in a single dimension.

First, two images [$I_1(x_1)$ and $I_2(x_2)$] are acquired with equal and opposing imaging gradients in the desired direction of desired distortion correction (i.e. the phase-encode direction in EPI images or the readout direction of spin-echo images near metal implants). The image distortion then occurs in opposite directions, but with different character due to the added superposition of imaging gradient fields with opposite sign. For each line in the distorted direction, a boundary is found at one of the images and then the distance between this boundary and the corresponding point in the other image is estimated by integrating each image in the distorted direction. Where the integrals match, is where the two points correspond to one another. The midpoint of the two points is then the point where signal would lie in a non-distorted image [$I_0(x)$]. This process is repeated until a full mapping of points in each image is uncovered:

$$x \to x_1 \text{ and } x \to x_2 \qquad [1]$$

This is effectively the same as knowing the magnetic field map at each point in the image, since:

$$x_1 = x + \alpha B_0(x), \text{ and } x_2 = x - \alpha B_0(x); \qquad [2]$$

where $\alpha$ is a known constant, and:

$$x = (x_1 + x_2)/2 \qquad [3]$$

Equation [3] is the mathematical basis of the line-integral method previously described. Knowing this mapping, the intensity of the non-distorted image is also uncovered as:

$$I(x) = 2 I_1(x_1) I_2(x_2) / [I_1(x_1) + I_2(x_2)]. \qquad [4]$$

On its own, the line-integral method has not been successfully demonstrated or utilized near metallic implants in spin-echo images. There is a clear reason for this lack of application. Equations [2-4] are valid under the assumption that the mappings generally expressed in Equation [1] are monotonic (i.e. the distorted images map back to one and only one point in the non-distorted image). This mathematical condition is violated where the extraneous magnetic field inhomogeneity gradient is greater than the gradient used to encode the MR images in the distorted direction. In regions where this mathematical condition is violated, both the mappings and the intensity calculation [4] become invalid. That is, the mappings and intensity calculation become invalid for correcting distortions in the slice direction if the magnetic field inhomogeneity gradient is greater than the slice-select gradient. This violation also occurs in the readout direction when the magnetic field inhomogeneity gradient in the readout direction is greater than the readout gradient. Unfortunately, these very inequalities are quite often encountered near metallic implants. Therefore, the typical line-integral based repair of distorted images cannot be used in such regions. Furthermore, it is generally believed not possible for the typical line-integral method to perform any "self-diagnosis" in identifying regions where its methods are limited. This quandary renders the standard application of the line-integral method virtually useless near metallic implants. Extra information would be needed to tell the line-integral method where to evaluate Equations [2-4] and where other methods should be implemented. An operator could determine regions by guessing where the mathematical condition is not violated and then apply the method in those regions. However, as one skilled in the art will readily acknowledge, this guessing game would be unsuccessful in accurately defining the boundaries of the regions.

One skilled in the art would immediately appreciate the benefit of accurately determining regions where the inequality is valid and not valid in spin-echo images. If the regions are defined accurately, more robust MR images of areas where implants are present can be created. For example, in the field of arthroplasty, implants are often used for joint repair. Most often, there is a strong need for accurate MR images of the implant and areas in the immediate vicinity of the implant. Without accurately determined regions, accurate conventional MR images are currently unattainable.

It would, therefore, be desirable to have a method of determining a region where the line-integral method can be successfully implemented and determining another region where other methods can be successfully applied to repair distorted MR images.

BRIEF DESCRIPTION OF THE INVENTION

The present invention provides a method and apparatus that overcome the above-mentioned limitations. A region where the magnetic field inhomogeneity in a particular direction is less than the slice-select or readout gradient in such direction is determined in an imaging field of view such that distortion correction may be applied thereto.

In accordance with one aspect of the present invention, an MR apparatus includes a plurality of gradient coils positioned about a bore of a magnet to impress a polarizing magnetic field about a subject to be imaged and an RF transceiver system and an RF switch controlled by a pulse module to transmit RF signals to an RF coil assembly to acquire MR images. The computer is programmed to locate a foreign object in a subject, define a localized area of a field of view about the foreign object where a magnetic field distortion adversely affects a first magnetic distortion correction technique, apply a second magnetic distortion correction technique to the localized area, apply the first magnetic distortion correction technique to the field of view other than in the localized area. The results of each distortion correction technique are combined and an image is reconstructed therefrom.

In accordance with another aspect of the present invention, a technique for improving magnetic field distortion caused by a foreign object in a subject is implemented. The technique includes computing a magnetic field distribution map of a field of view containing distortion therein from the foreign object. Using this full magnetic field distribution map, an inhomogeneity gradient region is located. In addition, at least one region for distortion improvement in an MR image is defined using the magnetic field distribution map with the located inhomogeneity region.

In accordance with yet another aspect of the present invention, a computer readable storage medium having stored thereon a computer program comprising instructions which when executed by a computer cause the computer to determine a coordinate system of a field of view containing distortion therein. The computer further determines a location of an object magnetic field in the coordinate system and registers the object magnetic field to the location. Further, at least one area of distortion space in the coordinate space in the coordinate system is defined and the area on an MR image is located.

Various other features and advantages of the present invention will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

Figure 1:
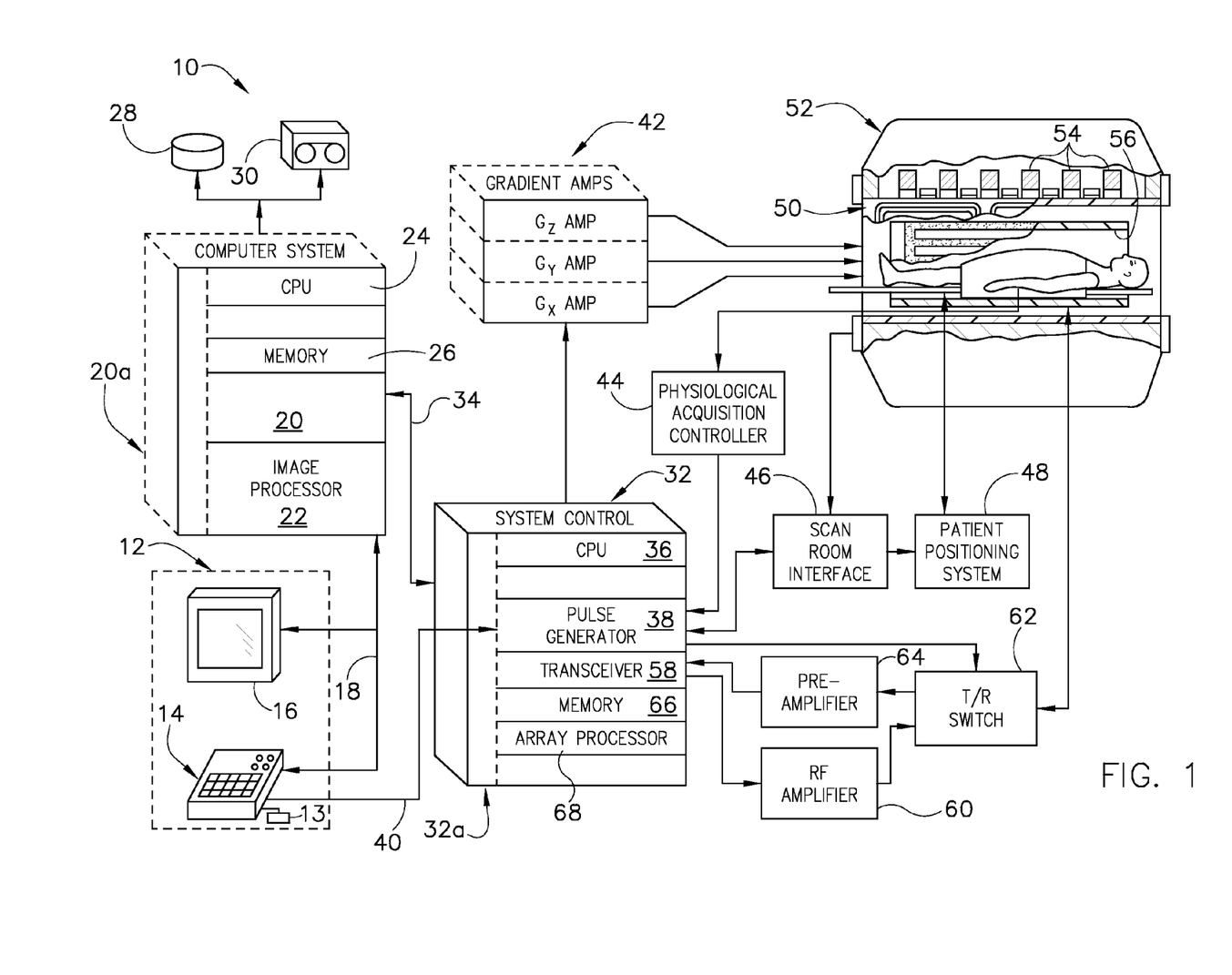
FIG. 1 is a schematic block diagram of an MR imaging system for use with an embodiment of the present invention.

Referring to FIG. 1, the major components of a preferred magnetic resonance imaging (MRI) system 10 incorporating an embodiment of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to determining regions where computed magnetic field inhomogeneity gradients in the direction of the slice-select gradient or the readout gradient is less than the applicable gradient: the slice-select gradient or the readout gradient, respectively. One skilled in the art would appreciate that this information also informs as to where the magnetic field inhomogeneity gradients are too large. By computing a full magnetic field distribution map of the region with its included implant, the invention generally provides more accurate determination of regions where specific distortion repair methods can be applied to spin-echo MR images. In turn, this results in a more robust distortion repair procedure.

Figure 2:
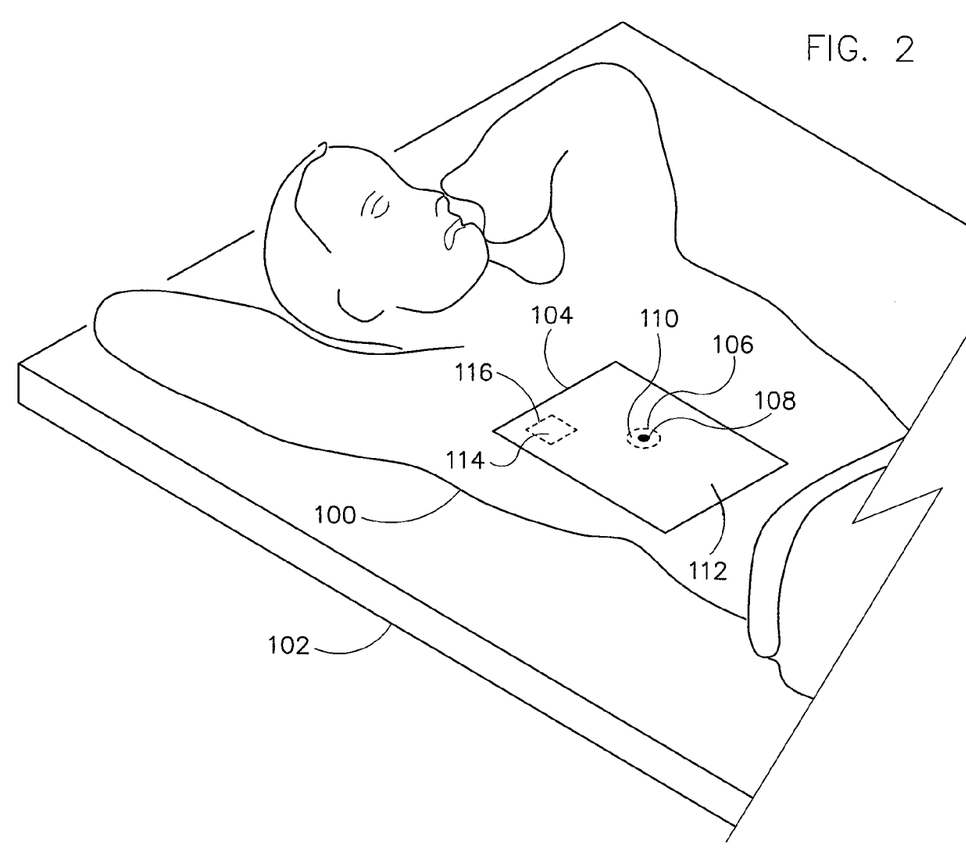
FIG. 2 depicts a subject on a scanning table of the system of FIG. 1 and shows a field of view created by the system of FIG. 1.

Referring now to FIG. 2, a subject 100 is depicted prone on a scanning table 102. A field-of-view (FOV) 104 of the MRI system 10 of FIG. 1 is shown generally about a foreign object 108 with metallic properties, such as an implant. The boundary 106, determined by the MRI system of FIG. 1, which will be more fully set forth hereinafter with respect to FIG. 4, defines a localized area 110, FIG. 2, about the foreign object 108. In addition, an area 112 other than the localized area 110 is also determined by the MRI system of FIG. 1. It is in these areas 110, 112 of FIG. 2, where appropriate correction techniques can be applied.

The MRI system of FIG. 1 determines or defines the areas 110, 112 of FIG. 2 by determining magnetic inhomogeneity gradients corresponding to the FOV 104. Area 112, other than the localized area 110, is where the magnetic field inhomogeneity gradient in a particular imaging direction is less than the respective imaging gradient. As such, the previously mentioned line-integral method can be successfully applied to this area 112. The particular imaging direction and respective imaging gradient used in the above inequality depend on the chosen direction of the improvement technique. That is, if the distortion improvement technique is performed in the slice direction, then this is the area 112 where a magnetic field inhomogeneity gradient in a slice direction is less than a slice-select gradient. On the other hand, if the distortion improvement technique is to be performed in the readout direction, then this is the area 112 where a magnetic field inhomogeneity gradient in a readout direction is less than a readout gradient. The line-integral technique may be applied, separately, in either the readout or slice direction. However, applying this technique in both the readout and slice direction generally results in an MR image with more robust distortion improvement.

The localized area 110, in contrast, is where the MRI system of FIG. 1, determines a magnetic field inhomogeneity gradient in a particular imaging direction is greater than the respective imaging gradient. In this localized area 110 of FIG. 2, the well known line-integral technique, with its line integration, is generally known by those in the art to fail. As a result, other distortion improvement techniques must be used for distortion improvement. For example, a signal conservation method that is known in the art may be used. This method uses the condition that the integral across each line in a particular gradient direction, slice or readout direction, must be the same for two input images and the final corrected image. After correcting the valid regions where the line-integral technique may be used, any remaining signal needed to satisfy this condition is added (equally or proportionally) to the regions not corrected by the line-integral technique. As with the line-integral technique, a more robust distortion improvement may be achieved by applying the signal conservation method in both the readout and slice direction.

Also depicted in FIG. 2 is a test region boundary 116, determined by an operator of the MRI system of FIG. 1, which defines the test region 114. This test region 114 is defined prior to, and separately from, the localized area 110 and the area 112 other than the localized area 110 and will be more fully set forth hereinafter in FIGS. 4 and 5.

Figure 3:
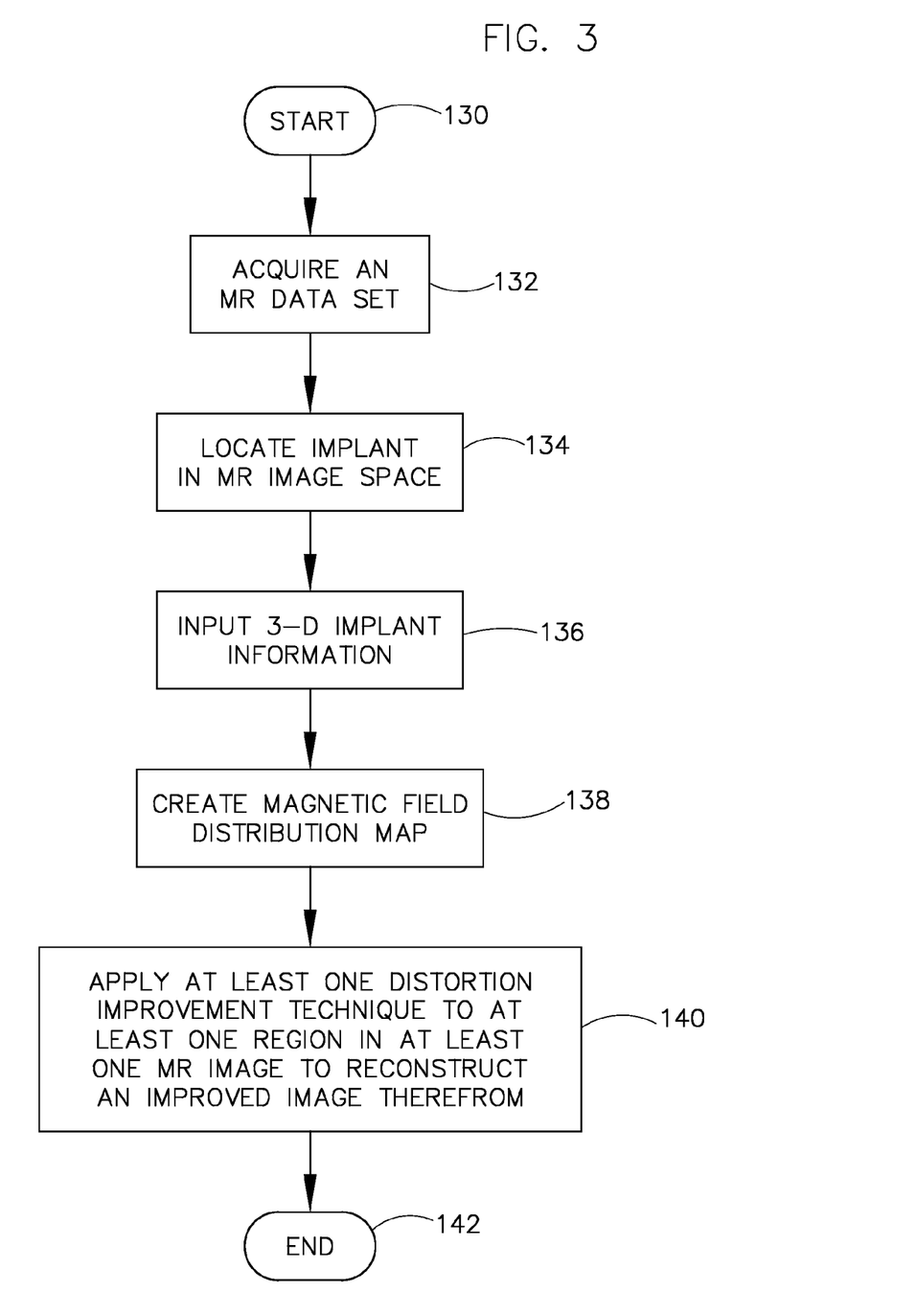
FIG. 3 is a flow chart depicting an overview presently contemplated for carrying out an embodiment of the invention.

Referring now to FIG. 3, an embodiment of the present invention is shown in a flow chart that depicts a technique implemented by an MRI system 10, FIG. 1, to reconstruct 140, FIG. 3, an image with distortion improvement. Starting at 130, the subject 100, FIG. 2, is prepared for an MR image study. Next, referring back to FIG. 3 and which will be more fully described later with respect to FIGS. 4, 5, and 6, an MR data set is acquired 132. As will also be described more fully with respect to FIGS. 4, 5, and 6, the implant is then located 134 in MR image space. After locating 134 the implant in MR image space, three-dimensional implant information is input 136 into the MRI system. It is contemplated, however, that the three-dimensional information may be input 136 during or before implant location 134, MR data set acquisition 132, or even before preparation of the subject 100, FIG. 2, for MR image study. The MRI system also creates 138, FIG. 3, a magnetic field distribution map, which will be more fully set forth with respect to FIG. 7. Once created 138, the magnetic field distribution map aids in the application 140 of at least one distortion improvement technique to at least one region in at least one MR image to reconstruct an improved image therefrom. This application 140 of at least one distortion improvement technique and image reconstruction will be more fully set forth hereinafter with respect to FIG. 8. After image reconstruction of 140, FIG. 3, the at least one distortion improvement technique implemented by the MRI system ends 142.

Figure 4:
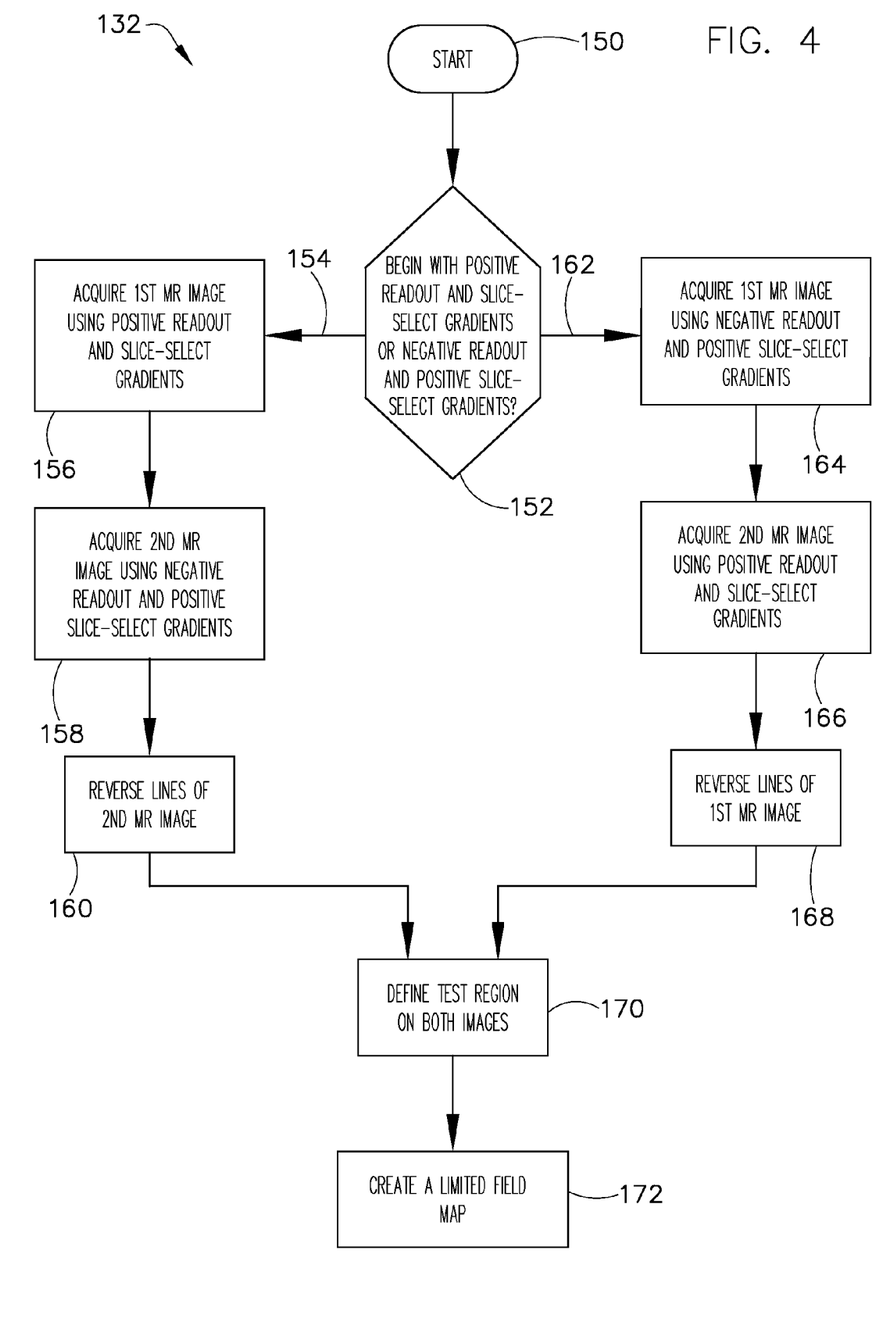
FIG. 4 is a flow chart depicting another embodiment for carrying out an aspect of the present invention.

Referring now to FIG. 4, another embodiment is depicted that shows a technique for acquiring 132 an MR data set that is used to locate 134, FIG. 3, an implant in MR image space. In addition, the results of the MR data set acquisition 132 are used to create 138, FIG. 3, a magnetic field distribution map. Starting at 150, FIG. 4, a determination 152 is made as to whether to begin MR acquisition with a positive readout gradient and slice-select gradient 154 or begin with negative readout and positive slice-select gradients 162. If the decision 152, 154 is made to begin with both positive gradients, then an MR image is acquired 156 using a positive readout and slice-select gradients. Then a second MR image is acquired 158 using a negative readout and positive slice-select gradients. After the second image is acquired 158, its lines in image space are reversed 160.

The properly applied line-integral technique, described in the BACKGROUND, is used in this technique of acquiring an MR data set 132. Referring back to FIG. 2, in order to properly apply the line-integral technique, a test region of an area 114 must be defined 116 by the user far enough away from the implant 108, to ensure that the implant magnetic field (not shown) allows for the application of the line-integral technique. That is, the test region must be an area 114 of the FOV 104 not adjacent to the foreign object 108: implant 108. Referring back to FIG. 4, the test regions of FIG. 2, are defined 170 in the first and second acquired 156, 158 MR images. A limited field map is then created 172 by applying the line-integral method to each defined 170 region of the two acquired 156, 158 MR images.

The acquisition 132 of an MR data set can be acquired in a similar manner if the choice 152, 162 is made to begin MR acquisition with negative readout and positive slice-select gradients. In this case, a first MR image would be acquired 164 using negative readout and positive slice-select gradients. Following acquisition 164 of the first image, a second MR image is acquired 166 using positive readout and slice-select gradients. Next, the lines of the first MR image are reversed 168. One skilled in the art would understand that, in order to apply the line-integral technique to the two acquired 164, 166 MR images, the lines of an image acquired 164 with at least one negative gradient should be reversed 168. It is, however, contemplated that the lines of the first acquired 164 MR image could be reversed 168 during or immediately after the acquisition 164 of the first MR image. In any event, after the acquisition 164, 166 of the two MR images and the reversal 168 of the first MR image's lines, the test regions are defined 170 on both images. The line-integral method is then applied to the defined 170 test regions in order to create 172 a limited field map. The creation 172 of the limited field map completes the acquisition 132 of an MR data set.

This limited field map that is created 172 contains magnetic field distribution information of the FOV 104 described in FIG. 2. As such, the created 172, FIG. 4 limited field map contains implant location information and implant magnetic susceptibility information. Using the implant location information, the implant 108, FIG. 2, is located 134, FIG. 3, in image space such that its orientation is estimated. As would be appreciated by those in the art, the steps set forth in FIG. 4 could be repeated multiple times, using the iterations to more accurately determine implant location and implant magnetic susceptibility. With regard to the magnetic susceptibility information, and which will be described more fully with respect to FIG. 7, the magnetic field distribution map is created 138, FIG. 3 using the magnetic susceptibility information.

Figure 5:
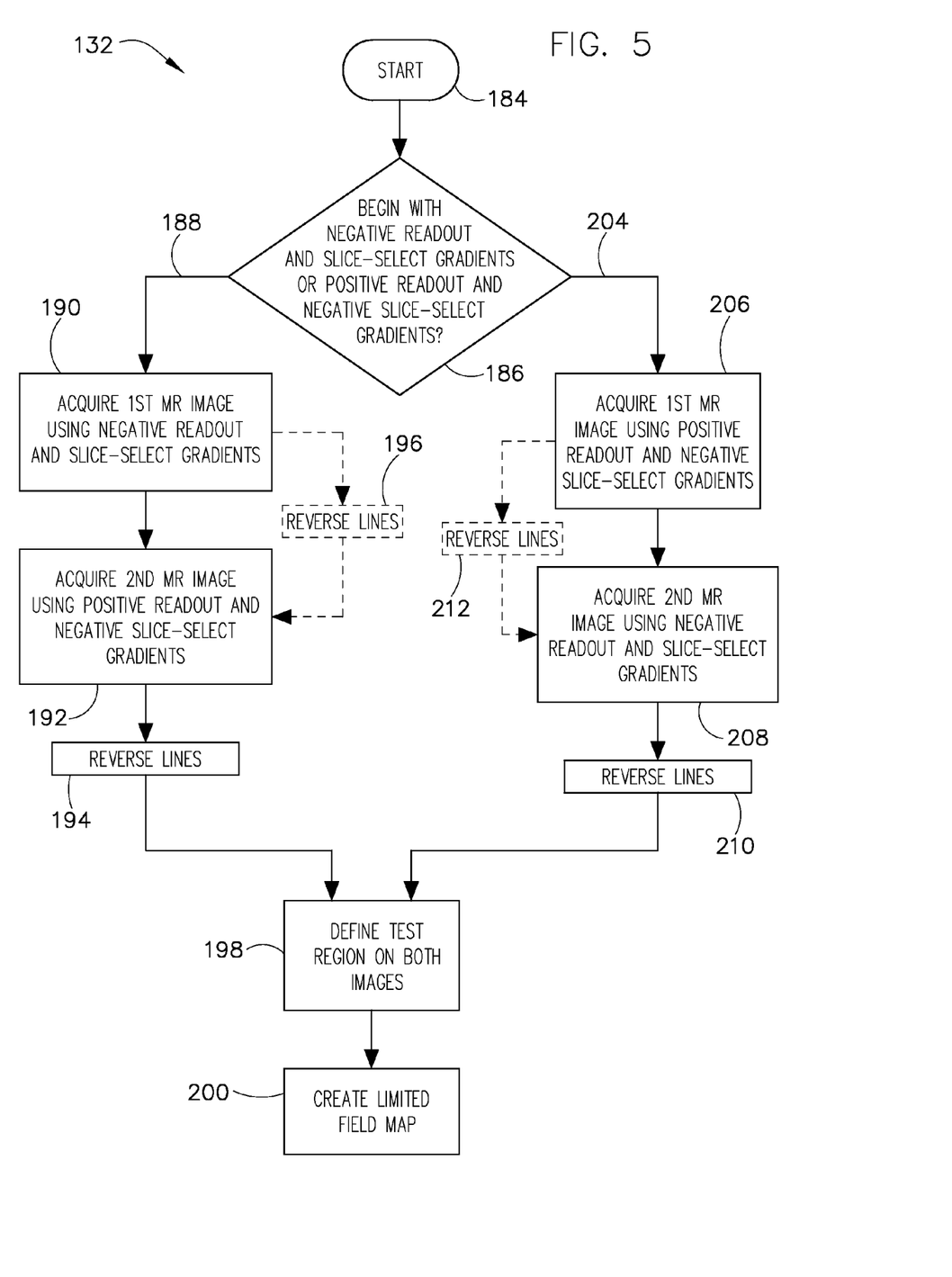
FIG. 5 is a flow chart depicting yet another embodiment of the present invention.

Referring to FIG. 5, yet another embodiment is depicted that shows a technique for acquiring an MR data set 132 that is used to locate 134, FIG. 3, an implant in MR image space. In addition, the results of this MR data set acquisition 132 are also used to create 138, FIG. 3, a magnetic field distribution map. Starting at 184, FIG. 5, a determination 186 is made as to whether to begin MR acquisition with negative readout and slice-select gradients 188 or with positive readout and negative slice-select gradients 204. If the choice 186, 188 is made to begin with negative readout and slice-select gradients, the first MR image is acquired 190 using these gradients. After the first MR image is acquired 190, a second MR image is acquired 192 using positive readout and negative slice-select gradients. Next, the lines of each image are reversed 194. An alternative technique is contemplated, in which the lines of the first acquired 190 MR image are reversed 196 immediately following its acquisition 190. In this case, only the lines of the acquired 192 second MR image would be reversed 194 following its acquisition 192. In either alternative, a test region, as described above with respect to FIG. 4, is then defined 198, FIG. 5, on both images. Following the definition 198 of the regions, a limited field map is created 200 using the line-integral technique.

Alternatively, it may be decided 186, 204 to begin MR acquisition with positive readout and negative slice-select gradients. In this case, the first MR image is acquired 206 using positive readout and negative slice-select gradients. After the first MR image is acquired 206, a second MR image using negative readout and slice-select gradients is acquired 208. Next, the lines of each MR image are reversed 210. An alternative technique is contemplated, however, in which the lines of the first acquired 206 MR image are reversed 212 immediately following its acquisition 206. In this case, only the lines of the second acquired 208 MR image would be reversed 210 following its acquisition 208. Next the test region, as described above with respect to FIG. 4, is defined 198, FIG. 5, on both acquired 206, 208 MR images. Following the definition 198 of the regions, a limited field map is created 200 using the line-integral technique, completing the acquisition of the MR data set 132.

As with the limited field map created 172 using the technique shown in FIG. 4, the limited field map that is created 200, FIG. 5, contains magnetic field distribution information of the FOV 104 described in FIG. 2. As such, the created 200, FIG. 5 limited field map contains implant location information and implant magnetic susceptibility information. Using the implant location information, the implant 108, FIG. 2, is located 134, FIG. 3, in image space such that its orientation is estimated. With regard to the magnetic susceptibility information, and which will be described more fully with respect to FIG. 7, the magnetic field distribution map is created 138, FIG. 3 using the magnetic susceptibility information. As would be appreciated by those in the art, the steps set forth in FIG. 5 could be repeated multiple times, using the iterations to more accurately determine implant location and implant magnetic susceptibility.

Figure 6:
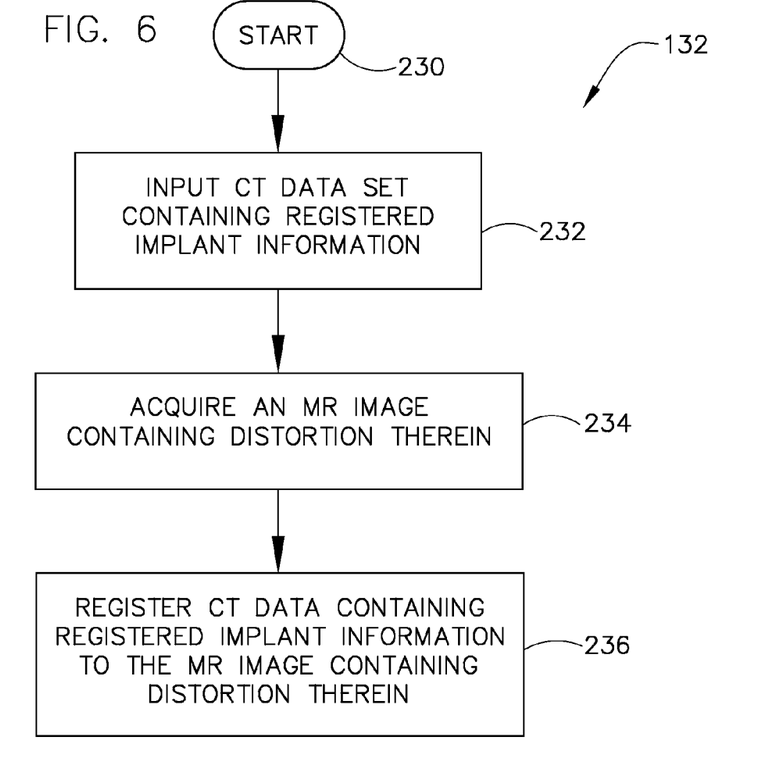
FIG. 6 is a flow chart depicting still another embodiment of the present invention.

Referring now to FIG. 6, still another embodiment is depicted that shows a technique for acquiring an MR data set 132 that is used to locate 134, FIG. 3, an implant in MR image space. Starting at 230, FIG. 6, a CT data set containing registered implant information is input 232 into the MRI system 10, FIG. 1. Next, an MR image, containing implant distortion therein, is acquired 234, FIG. 6. As an alternative, it is contemplated that the MR image can be acquired 234 during or before the input 232 of the CT data set containing registered implant information. Referring back to the present technique, following MR image acquisition 234, the input 232 CT data containing registered implant information is then registered 236 to the MR image. It is noted, that the registered implant information of 236 includes three-dimensional implant information along with implant location information. In addition, it would be appreciated by those in the art, that multi-plane x-ray data containing registered implant information could be input 232 and registered 236 instead of the CT data containing registered implant information. After the CT data (or multi-plane x-ray data) is registered 236 to the MR image, the MR data acquisition 132 is complete.

This acquired 132 MR data set is then used to locate 134, FIG. 3 the implant 108, FIG. 2, in image space such that its orientation is estimated. In addition, the input 232, FIG. 6, CT data set, containing registered implant information, also serves as the step or act of inputting 136, FIG. 3, three-dimensional implant information.

In yet another embodiment, an MR data set is acquired 132, FIG. 3, by first acquiring two MR images containing magnetic distortion from an implant, with each MR acquisition using differing gradients. One MR image is acquired using positive readout and slice-select gradients and second MR image acquired as the first but with a slightly temporally shifted refocusing pulse. From the two MR images, magnetic field estimates are determined, completing a technique for acquiring 132, FIG. 3, an MR data set. As with the MR data set acquired 132 with regard to FIGS. 4, 5, and 6, this MR data set also contains implant location information and is used to locate 134, FIG. 3 the implant in image space such that orientation can be estimated. In addition, as with the MR data set acquired 132 using the technique shown in FIG. 4 or 5, this MR data set contains implant magnetic susceptibility information, in which the susceptibility can be determined therefrom.

In yet another embodiment, an MR data set is acquired 132, FIG. 3, with a technique that uses a saline-solution phantom. In this embodiment, a saline-solution phantom is placed outside the subject 100 of FIG. 2, but within the field of view (not shown) that contains distortion from an implant. The MRI system of FIG. 1 then measures the reduced field distribution in the saline-solution phantom, completing the acquisition of the MR data set. With the reduced field distribution information, implant magnetic susceptibility can be determined as well as the location 134 of the implant in MR image space, as will be shown with respect to FIG. 7, to create 138, FIG. 3 the magnetic field distribution map.

As mentioned, the implant can be located 134 in image space from an MR data set acquired 132, FIG. 3, using any of the techniques mentioned, including those with respect to FIGS. 4, 5, and 6. However, it is contemplated that each technique shown in FIGS. 4, 5, and 6, or any combination of the mentioned techniques, can be used to determine implant location 134, FIG. 3, in image space. Comparing the implant location 134 results determined from each technique, or any combination of these techniques, will allow for the location 134 of the implant in MR image space to be determined more accurately.

Figure 7:
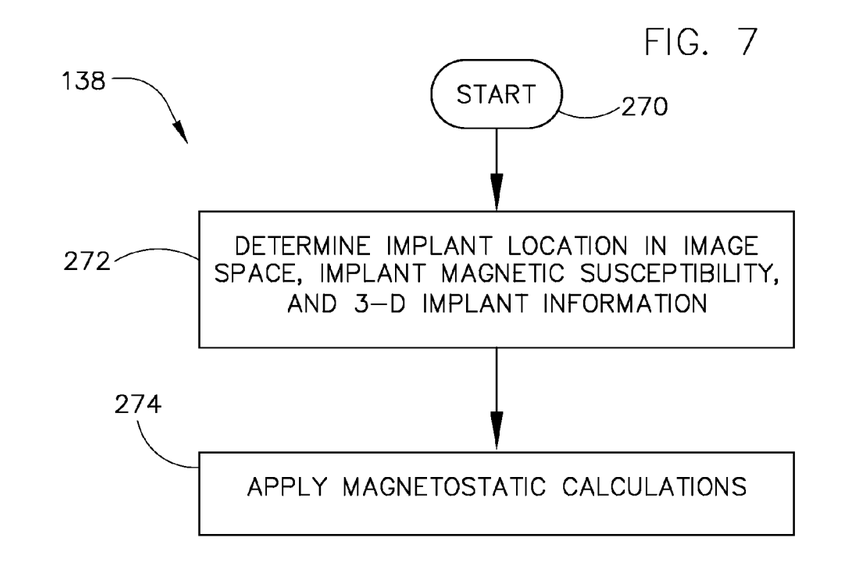
FIG. 7 is a flow chart depicting yet another embodiment of the present invention.

Referring now to FIG. 7, still another embodiment is shown in a flow chart depicting a technique to create 138 a magnetic field distribution map. Starting at 270, the implant location in image space, the implant magnetic susceptibility, and the three-dimensional implant information is determined at 272.

As mentioned, implant location can be determined from any of the above-mentioned techniques, including those with respect to FIGS. 4, 5, and 6. Implant magnetic susceptibility, however, can be determined from any of the techniques mentioned above, except the technique mentioned with respect to FIG. 6 (using Ct data or multi-plane x-ray data). If the MR data set were acquired 132 using the technique set forth in FIG. 6, in which CT data or multi-plane x-ray data were used, the implant magnetic susceptibility is determined from a source outside the MR data acquired 132 using such technique. For example, the implant magnetic susceptibility may be acquired from the implant manufacturer. In addition, it is contemplated that this implant magnetic susceptibility information may be acquired at any time during or before the creation 138 of a magnetic field distribution map. If any of the other techniques were used, besides the technique set forth in FIG. 6, the implant magnetic susceptibility is determined from the respective MR data set, as mentioned under the respective technique description.

The three-dimensional implant information may also be determined in a variety of different ways. If using the MR data set acquired 132 using the technique set forth with respect to FIG. 6, the three-dimensional implant information is determined from the MR image that has the CT data containing registered implant information registered 236 to it. If the MR data set was acquired 132 using any of the other techniques, the three-dimensional implant information is determined from an outside source, such as the implant manufacturer. It is contemplated, however, that the three-dimensional implant information could come from any source, even a database that is part of the MRI system 10, FIG. 1. As such, the determined 272, FIG. 7 three-dimensional implant information may be input 136, FIG. 3, into the MRI system 10, FIG. 1, prior to or during image reconstruction 140 set forth in FIG. 3.

After locating the implant in MR image space, determining implant magnetic susceptibility, and the implant three-dimensional information is determined 272, any of the well-known three dimensional magnetostatic calculations are applied 274 to create a magnetic field distribution map 138. As mentioned, any of the three-dimensional magnetostatic calculations known in the art may be used. For example, the following equation may be applied to create a magnetic field distribution map: $\Delta B_0(x) = FFT^{-1}[B_0 * FFT[(1/3 - k_z^2/|k|^2)\chi(x)]]$; where $x = (x, y, z)$, FFT is a fast-Fourier transform (or its inverse $FFT^{-1}$), $k = (k_x, k_y, k_z)$ is the Fourier transform space coordinate, $B_0$ is the applied static magnetic field strength (i.e. 1.5, 3.0, 7.0 Tesla), and $\chi$ is the magnetic susceptibility.

One skilled in the art will appreciate that, by applying 274 the magnetostatic calculations, the magnetic field of the implant 108, FIG. 2, is computed to create a magnetic field distribution map 138. Alternatively, but in a similar manner, it can be interpreted that the magnetostatic calculations 274 estimate the magnetic field of the implant 108, FIG. 2, and registers it to the coordinate system created from an acquired 132, FIG. 3, MR data set. As will also be appreciated by one skilled in the art, the created 138 magnetic field distribution map contains magnetic field inhomogeneity information.

Figure 8:
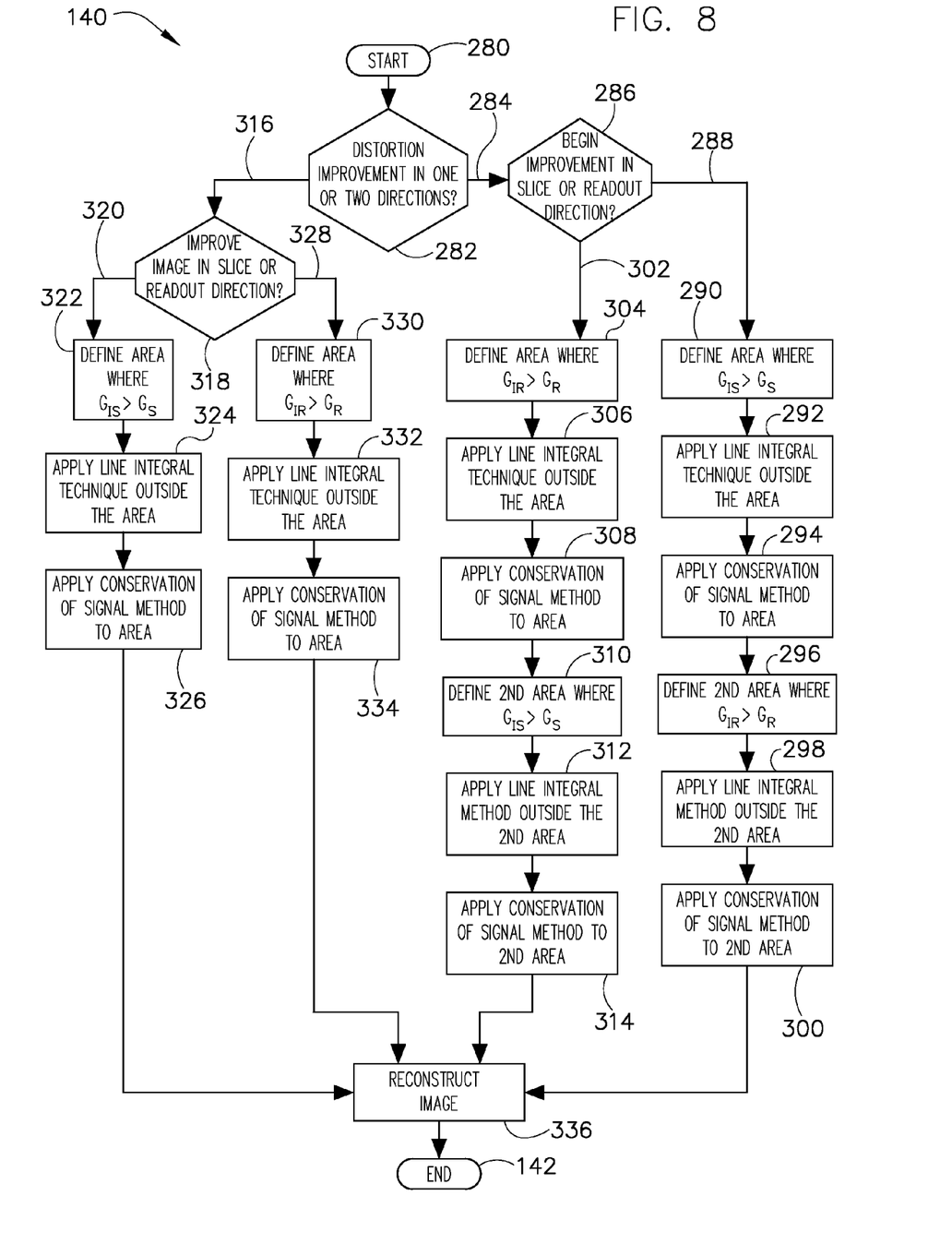
FIG. 8 is a flow chart depicting another embodiment of the present invention.

Now referring to FIG. 8, still another embodiment depicts, with a flow chart, a technique to apply 140, FIG. 3, at least one distortion improvement technique to at least one area on at least one MR images to reconstruct an image therefrom. Starting at 280 with the created 138, FIG. 3 magnetic field distribution map, it is determined 282 whether to improve magnetic distortion in only one direction 316 or two directions 284. If correction in two directions is chosen 282, 284, then it is determined 286 whether to begin distortion improvement in the slice direction 288 or readout direction 302. If the slice direction is chosen 286, 288, an area is defined 290 in the slice-select direction where the inhomogeneity gradient in the slice direction ($G_{IS}$) is greater than the slice-select gradient ($G_S$) on the magnetic field distribution map 138, FIG. 3. Next, the line-integral technique is applied 292, FIG. 8, to an area 112, FIG. 2, outside the defined 290 area, to the two acquired MR images, as set forth with respect to FIG. 4 or 5. Then, the conservation of signal method, previously described, is applied 294: adding any remaining signal (proportionally or equally) to the defined 290 area. Following the application 294 of the conservation of signal method, a second area is defined 296 where the inhomogeneity gradient in the readout direction ($G_{IR}$) is greater than the readout gradient ($G_R$) on the magnetic field distribution map 138 of FIG. 3. Next, the line-integral technique is applied 298 outside the second defined 296 area. After the line-integral technique is applied in the readout direction 298, the conservation of signal method is applied 300 to the second defined 296 area. The technique is completed at 142, after an image is reconstructed 336.

On the other hand, if the readout direction is chosen 286, 302 for the starting improvement direction, an area 110, FIG. 2, is defined 304, FIG. 8, in the readout direction where the inhomogeneity gradient in the readout direction ($G_{IR}$) is greater than the readout gradient ($G_R$) on the magnetic field distribution map 138, FIG. 3. Next, the line-integral technique is applied 306, FIG. 8, to an area 112, FIG. 2, outside the defined 304 area to the two acquired MR images, as set forth with respect to FIG. 4 or 5. Then, the conservation of signal method, previously described, is applied 308 to the defined 304 area: adding any remaining signal (proportionally or equally) to the defined 304 area. Following the application 308 of the conservation of signal method, a second area is defined 310 where the inhomogeneity gradient in the slice-select direction ($G_{IS}$) is greater than the slice-select gradient ($G_S$) on the magnetic field distribution map 138 of FIG. 3. Next, the line-integral technique is applied 312 to an area 112, FIG. 2, outside the second defined 310 area. After the line-integral technique is applied 312 in the slice direction, the conservation of signal method is applied 314 to the second defined 310 area. The technique is completed at 142, after an image is reconstructed 336.

As an alternate to improving distortion in two directions, improvement in only one direction may be chosen 282, 316. In this case, it needs to be determined 318 whether to cause improvement in the slice direction 320 or the readout direction 328. If the slice direction is chosen 318, 320, an area where the inhomogeneity gradient (GIs) in the slice direction is greater than the slice-select gradient (Gs) is defined 322. One skilled in the art will appreciate that this step actually defines N+1 areas in distortion space, where N is an integer greater than zero. Next, using two MR images from the data set of FIG. 4 or 5, the line-integral technique is applied 324 outside the defined 322 area, where the inhomogeneity gradient in the slice direction ($G_{IS}$) is less than the slice-select gradient ($G_S$). Next, the conservation of signal method is applied 326 to the defined area 322. The technique is completed at 142, after an image is reconstructed 336.

On the other hand, it may be determined 318 to improve distortion in the readout direction 328. In this situation, an area in image space, such as the space created by the magnetic field distribution map 138 of FIG. 3, where the inhomogeneity gradient in the readout direction ($G_{IR}$) is greater than the readout gradient ($G_R$) is defined 330. One skilled in the art will appreciate that this step or act actually defines N+1 areas in distortion space, where N is an integer greater than zero. Next, using two MR images from the data set 132 of FIG. 4 or 5, apply 332 the line-integral technique to area 112, FIG. 2, outside the defined 330 area, where the inhomogeneity gradient in the readout direction is less than the readout gradient. Next, apply 334 the signal conservation method to the chosen two MR images from MR data set 132 of FIG. 4 or 5, in the readout direction in the defined 330 area. This technique is completed at 142 after am image is reconstructed 336.

In yet another embodiment, the MR system of FIG. 1 corrects distortion in MR images using four acquired MR images containing distortion therein from an implant. In a first set, the MR system acquires two spin-echo MR images: one is acquired with positive readout and slice-select gradients and the second is acquired with a negative readout gradient and positive slice-select gradient. A second set of spin-echo MR images is then acquired: one acquired with positive readout and negative slice-select gradients and the second is acquired with negative readout and slice-select gradients. Since the order in which the images are acquired may be changed, all variations of the above order are contemplated. After the images are acquired, a limited field map is created, as described above with respect to FIGS. 4 and 5, using the first set of MR images. In addition, a second limited field map is created using the second set of MR images. The two limited field maps are compared and field estimates in agreement are identified. Using the field estimates in agreement, the implant is located in a coordinate system defined by the image space, such that its orientation is estimated. In addition, implant magnetic susceptibility is determined. Next, using magnetostatic field calculations, limited field map information, and given information about the implants three-dimensional characteristics, a magnetic field distribution map is computed. A region where the inhomogeneity gradient in the readout direction is greater than the readout gradient is defined using the magnetic field distribution map. The line-integral method is then used on the first and second set of MR images to create fifth and sixth image. Then, using the signal conservation method already described, areas not previously defined can be improved, resulting in two MR images with magnetic distortion improved in the readout direction.

In addition, similar steps may be applied to cause improvement in the slice-select direction. In this case, a region where the inhomogeneity gradient in the slice direction is greater than the slice-select gradient is defined using the magnetic field distribution map. The line-integral method is then used on the first and second set of MR images to create seventh and eighth image. Then, using the signal conservation method already described, areas not previously defined can be improved, resulting in two MR images with magnetic distortion improved in the slice direction.

It is also contemplated that the above technique can be applied in both the readout and slice-select direction for a more robust distortion improvement.

A technical contribution for the disclosed method and apparatus is that it provides for a computer implemented program to cause a computer define at least one region, in an MR image with distortion caused by an implant therein, for distortion correction and to apply a distortion correction technique the at least one region.

Therefore, according to one embodiment of the present invention, an MR apparatus includes a plurality of gradient coils positioned about a bore of a magnet to impress a polarizing magnetic field about a subject to be imaged, and an RF transceiver system and an RF switch controlled by a pulse module to transmit RF signals to an RF coil assembly to acquire MR images. The computer is programmed to locate a foreign object in a subject, define a localized area of a field of view about the foreign object where a magnetic field distortion adversely affects a first magnetic distortion correction technique, apply a second magnetic distortion correction technique to the localized area, and apply the first magnetic distortion correction technique to the field of view other than in the localized area. The results of each distortion correction technique are combined and an image is reconstructed therefrom.

In accordance with another embodiment of the present invention, a technique for improving magnetic field distortion caused by a foreign object in a subject is implemented. The technique includes computing a magnetic field distribution map of a field of view containing distortion therein from the foreign object. Using this full magnetic field distribution map, an inhomogeneity gradient region is located. In addition, at least one region for distortion improvement in an MR image is defined using the magnetic field distribution map with the located inhomogeneity region.

In accordance with yet another embodiment of the present invention, a computer readable storage medium having stored thereon a computer program comprising instructions which when executed by a computer cause the computer to determine a coordinate system of a field of view containing distortion therein. The computer further determines a location of an object magnetic field in the coordinate system and registers the object magnetic field to the location. Further, at least one area of distortion space in the coordinate space in the coordinate system is defined and the area on an MR image is located.

The present invention has been described in terms of the preferred embodiment, and it is recognized that equivalents, alternatives, and modifications, aside from those expressly stated, are possible and within the scope of the appending claims.

What is claimed is:

1. A magnetic resonance (MR) apparatus comprising:
    a plurality of gradient coils positioned about a bore of a magnet to impress a polarizing magnetic field about a subject to be imaged, and an RF transceiver system and an RF switch controlled by a pulse module to transmit RF signals to an RF coil assembly to acquire MR images; and
    a computer programmed to:
        locate a foreign object in a subject;
        define a localized area of a field of view about the foreign object where a magnetic field distortion adversely affects a first magnetic distortion correction technique;
        apply the first magnetic distortion correction technique to the field of view other than in the localized area;
        apply a second magnetic distortion correction technique to the localized area; and
        combine results of the application of the first and second magnetic distortion correction techniques and reconstruct an image therefrom.

2. The apparatus of claim 1 wherein the first magnetic distortion correction technique is performed with line integration.

3. The apparatus of claim 1 wherein the computer is further programmed to create a magnetic field distribution map, wherein the magnetic field distribution map contains magnetic field inhomogeneity information.

4. The apparatus of claim 3 wherein the localized area is defined where a magnetic field inhomogeneity gradient in a readout direction is greater than a readout gradient and the field of view other than the localized area is defined where a magnetic field inhomogeneity gradient in a readout direction is less than a readout gradient.

5. The apparatus of claim 3 wherein the localized area is defined where a magnetic field inhomogeneity gradient in a slice direction is greater than a slice-select gradient and the field of view other than the localized area is defined where a magnetic field inhomogeneity gradient in a slice direction is less than a slice-select gradient.

6. The apparatus of claim 1 wherein the computer is further programmed to acquire a first MR image having distortion therein from the foreign object.

7. The apparatus of claim 6 wherein the computer is further programmed to acquire a second MR image having distortion therein from the foreign object.

8. The apparatus of claim 7 wherein the computer is further programmed to apply the first correction distortion technique to an area of the field of view not adjacent to the foreign object of the first and second MR images to create a limited field map.

9. The apparatus of claim 8 wherein the computer is further programmed to compute a magnetic field distribution map based on a magnetic field of the foreign object and the limited field map.

10. The apparatus of claim 9 wherein the computer is further programmed to identify the localized area in the magnetic field distribution map.

11. A technique for correcting magnetic field distortion caused by a foreign object in a subject comprising:
    computing a magnetic field distribution map of a field of view containing distortion therein from the foreign object;
    locating an inhomogeneity gradient region in the magnetic field distribution map; and
    defining at least one region for distortion improvement in an MR image using the magnetic field distribution map with the located inhomogeneity gradient region.

12. The technique of claim 11 further comprising locating the foreign object in a limited field map, wherein the limited field map contains location information.

13. The technique of claim 12 wherein the magnetic field distribution map is computed from foreign object magnetic field information and limited field map information.

14. The technique of claim 13 wherein the foreign object magnetic field information is computed from foreign object magnetic susceptibility.

15. The technique of claim 11 wherein the inhomogeneity gradient region is at least one of an area where a readout gradient is less than an inhomogeneity gradient and an area where a readout gradient is greater than an inhomogeneity gradient.

16. The technique of claim 11 wherein the inhomogeneity gradient region is at least one of an area where a slice-select gradient is less than an inhomogeneity gradient and an area where the slice-select gradient is greater than the inhomogeneity gradient.

17. The technique of claim 11 further comprising applying a distortion improvement technique to the at least one region to create the MR image with reduced distortion about the foreign object.

18. A computer readable storage medium having stored thereon a computer program comprising instructions which when executed by a computer cause the computer to:
    determine a coordinate system of a field of view containing distortion therein;
    determine a location of an object magnetic field in the coordinate system;
    register the object magnetic field to the location;
    define at least one area of distortion space in the coordinate system; and
    locate the area on an MR image.

19. The computer readable storage medium of claim 18 further comprising instructions to cause the computer to compute the object magnetic field and a limited field map of the field of view.

20. The computer readable storage medium of claim 19 further comprising instructions to cause the computer to determine the coordinate system from the limited field map.

21. The computer readable storage medium of claim 18 wherein there are N+1 located areas of distortion space.

22. The computer readable storage medium of claim 21 further comprising instructions to cause the computer to improve distortion in the N+1 areas of distortion space.

23. The computer readable storage medium of claim 18 wherein the location of the object magnetic field is determined from the one of CT data containing registered object information and multi-planar x-ray data containing registered object information.

24. The computer readable storage medium of claim 18 wherein the at least one area of distortion space defined in the coordinate system surrounds at least a portion of the object magnetic field registered to the location.

* * * * *

UNITED STATES PATENT AND TRADEMARK OFFICE
CERTIFICATE OF CORRECTION

PATENT NO. : 7,535,227 B1
APPLICATION NO. : 11/925141
DATED : May 19, 2009
INVENTOR(S) : Koch et al.

It is certified that error appears in the above-identified patent and that said Letters Patent is hereby corrected as shown below:

Col. 14, line 37 (Claim 15), delete "a readout" and substitute therefore -- the readout --;

Col. 14, line 37 (Claim 15), delete "an inhomogeneity" and substitute therefore -- the inhomogeneity --.

Signed and Sealed this

Fourteenth Day of July, 2009

JOHN DOLL
*Acting Director of the United States Patent and Trademark Office*